United States Patent [19]

Singh et al.

[11] Patent Number: 4,584,681
[45] Date of Patent: Apr. 22, 1986

[54] MEMORY CORRECTION SCHEME USING SPARE ARRAYS

[75] Inventors: Shanker Singh, Fishkill, N.Y.; Vijendra P. Singh, Saratoga, Calif.

[73] Assignee: International Business Machines Corporation, Armonk, N.Y.

[21] Appl. No.: 528,769

[22] Filed: Sep. 2, 1983

[51] Int. Cl.[4] .................... G01R 31/28; G06F 11/10
[52] U.S. Cl. .......................................... 371/10; 371/5; 371/21
[58] Field of Search ............... 371/5, 10, 21, 38; 365/201; 324/73 R

[56] References Cited

U.S. PATENT DOCUMENTS

| | | | |
|---|---|---|---|
| 3,772,652 | 11/1973 | Hilberg | 364/200 |
| 3,868,646 | 2/1975 | Bergman | 364/200 |
| 3,906,200 | 9/1975 | Petschauer | 371/10 |
| 3,917,933 | 12/1975 | Scheuneman | 371/10 |
| 3,999,051 | 12/1976 | Petschauer | 371/5 X |
| 4,066,880 | 1/1978 | Salley | 371/10 X |
| 4,093,985 | 6/1978 | Das | 364/200 |
| 4,209,846 | 6/1980 | Seppa | 364/900 |
| 4,414,665 | 11/1983 | Kimura | 365/201 X |
| 4,422,161 | 12/1983 | Kressel et al. | 371/10 X |
| 4,428,068 | 1/1984 | Baba | 365/201 X |
| 4,456,995 | 6/1984 | Ryan | 371/21 |
| 4,459,685 | 7/1984 | Sud et al. | 371/10 X |

Primary Examiner—Charles E. Atkinson
Attorney, Agent, or Firm—James E. Murray

[57] ABSTRACT

Spare chips are employed together with a replacement algorithm to replace chips in memory array when failure is generally more extensive then unrelated cell fails in the memory chips. That is, substitution will be made if an error condition is a result of the failure of a whole chip (chip-kill), a segment of a chip (island-kill), a column of bits of a chip or a row of bits of a chip but will not be performed when it is due to a single failed cell. The replacement of a chip with a chip-kill or with an island-kill is done on the fly and involves only a row of the memory chips or elements leaving other elements of the memory unaffected by the replacement.

13 Claims, 8 Drawing Figures

FIG. 4

| FAULTS | # OF PAGES | # OF ECC WRD/PAGE | ERROR PATTERN LENGTH & MUTUAL DISTANCE | PAGE PATTERN |
|---|---|---|---|---|
| CELL | 1 | 1 | 1, ADDRESS $a_i$ | PAGE ADDR. $P_j$ |
| BIT LINE | 256 | 1 | 1, ADDRESS $a_i$ | $p_j, p+16, P+2...$ |
| WORD LINE | 64 | 16 | ADDRESS $a_i, a+16$ $a+32...$ | $p_j, p_j+1, p_j+2...$ |
| CHIPKILL | 4K (1/4ESM) | 16 | SAME AS WORD LINE | $p_j, p_j+1, p_j+2...$ |

MEMORY CORRECTION SCHEME USING SPARE ARRAYS

BACKGROUND OF THE INVENTION

The present invention relates to correction of faulted memory using spare memory arrays.

In Bond, U.S. patent application Ser. No. 381,266, filed May 24, 1982, now U.S. Pat. No. 4,489,403 issued December 18, 1984, and entitled "Fault Alignment Control System and Circuits", Aichelmann, Jr. et al., U.S. patent application Ser. No. 429,644, filed Sept. 30, 1982, now U.S. Pat. No. 4,506,364 issued Mar. 19, 1985, and entitled "Memory Address Permutation Apparatus", Bossen et al., U.S. patent application Ser. No. 362,925, filed Mar. 29, 1982, now U.S. Pat. No. 4,461,001 issued July 17, 1984, and entitled "Deterministic Permutation Apparatus" and Singh et al., U.S. patent application Ser. No. 383,640, filed June 1, 1982, now U.S. Pat. No. 4,485,471 issued Nov. 27, 1984, and entitled "A Method of Fault Map Generation for Fault Tolerant Memory", the addresses supplied to the decoders of the memory elements storing the various bit positions of a codeword are skewed relative to one another when an uncorrectable error condition is detected in the codeword to change which memory cells store the faulted codeword. This scheme separates stuck bits which caused the uncorrectable error so that they cause correctable error conditions only. For instance, if the memory was protected with a single error correcting code/double error detecting code, the two cells storing the faulted bits of the codeword containing a detectable error would be placed so that they occur in two separate codewords where the four would produce two separate correctable error conditions.

While such relocation schemes maintain memory availability, the available memory space becomes "dirty" as a result of the accumulation of bad bits within the space as time passes. This problem is particularly acute where the failed bits are grouped in a completely bad memory chip or are the result of a plurality of bit line or word line fails. Furthermore, with address permutation schemes when a detectable uncorrectable error is detected the whole memory has to be flushed of data while the address skewing process is being performed resulting in a significant down time for the memory.

It has been suggested that memories contain spare arrays which would be used to replace any bad bit in the memory. In one such memory, the location of bad bits are stored separately and whenever memory access is made to an address containing an error, a bit from one of the spare arrays is substituted for the bad bit on a bit by bit basis. While this arrangement ends the accumulation of bad bits in the memory it results in significant increase in the access time of the memory. To get around this problem, it has been suggested that element substitution be done on a column or row basis as in Choate, U.S. Pat. No. 4,051,354, Harper, U.S. Pat. No. 3,633,175, Chesley, U.S. Pat. No. 4,038,648 and Goldberge, U.S. Pat. No. 3,995,261. This involves use of whole spare rows or columns of chips which is quite an inefficient way to use spare memory capacity.

THE INVENTION

In accordance with the present invention, spare chips are employed together with a replacement algorithm to replace chips in memory array when failure is generally more extensive then unrelated cell fails in the memory chips. That is, substitution will be made if an error condition is a result of the failure of a whole chip (chip-kill), a segment of a chip (island-kill), a column of bits of a chip, or a row of bits of a chip but will not be performed when it is due to a single failed cell. The replacement of a chip with a chip-kill or with an island-kill is done on the fly and involves only a row of the memory chips or elements leaving other elements of the memory unaffected by the replacement. In the preferred embodiment, the amount of spares needed with the scheme is quite small relative to the total elements in the array. For instance, in one of the illustrated embodiments only two spares are needed for a 64×4 memory array. This is because the two spare arrays can be placed in any positon in a column or row of the matrix of arrays.

Therefore, it is the object of the present invention to provide a sparing scheme in which memory elements are replaced in an operating machine with a zero or absolute minimum down time.

It is another object of the present invention to provide a memory element replacement scheme that requires a minimum of spare memory elements.

It is a further object of the invention to provide a memory element replacement scheme that uses minimum of logic and a simple replacement algorthim.

THE DRAWINGS

These and other objects of the invention can best be understood by referring to the accompanying drawings of an illustrated embodiment of the invention of which:

FIG. 4 is a table showing the effect of various types of failures on the words in the memory;

DETAILED DESCRIPTION OF THE EMBODIMENT

Figure 1:
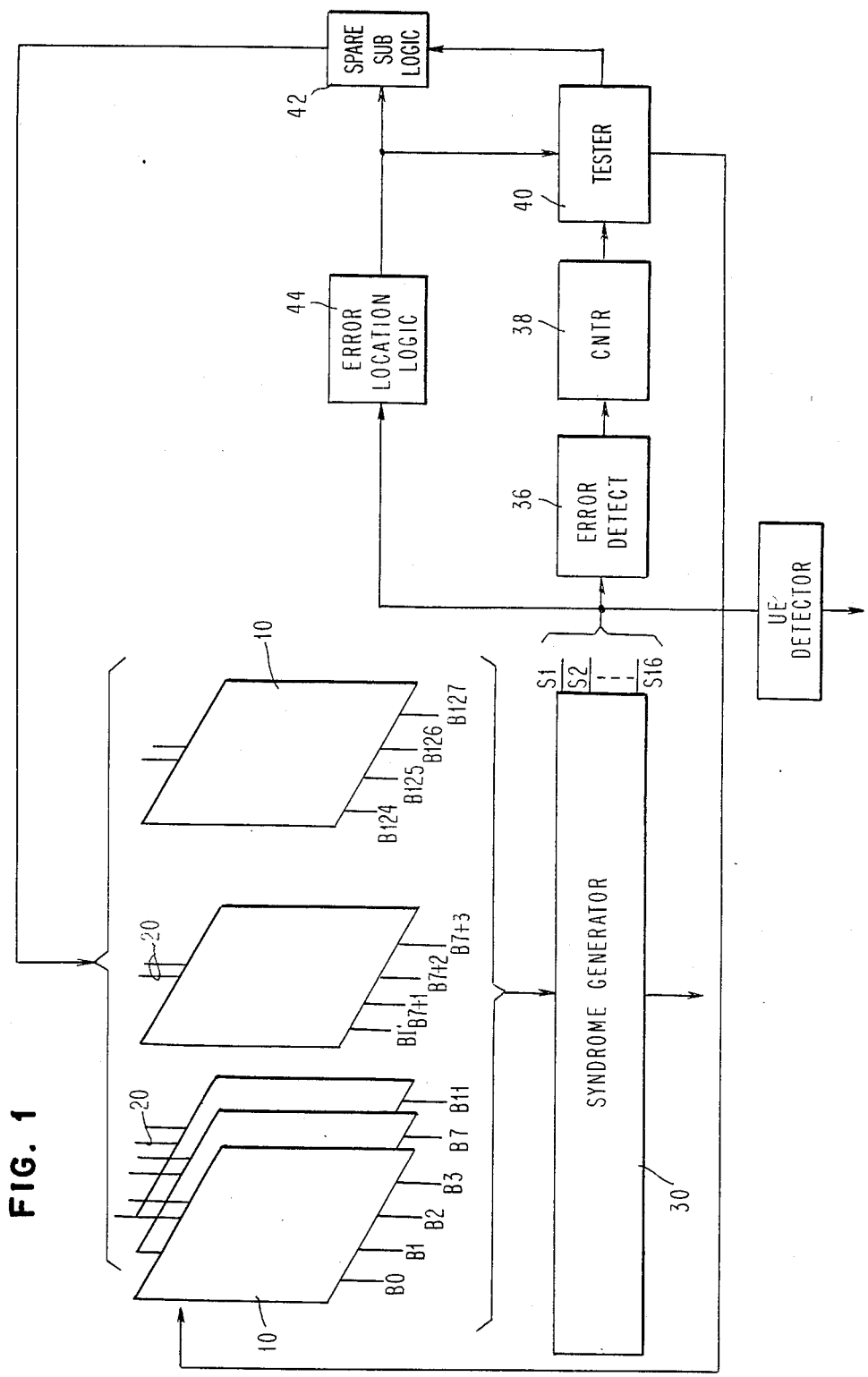
FIG. 1 is a schematic of a portion of a computer system incorporating the present invention.
Figure 2:
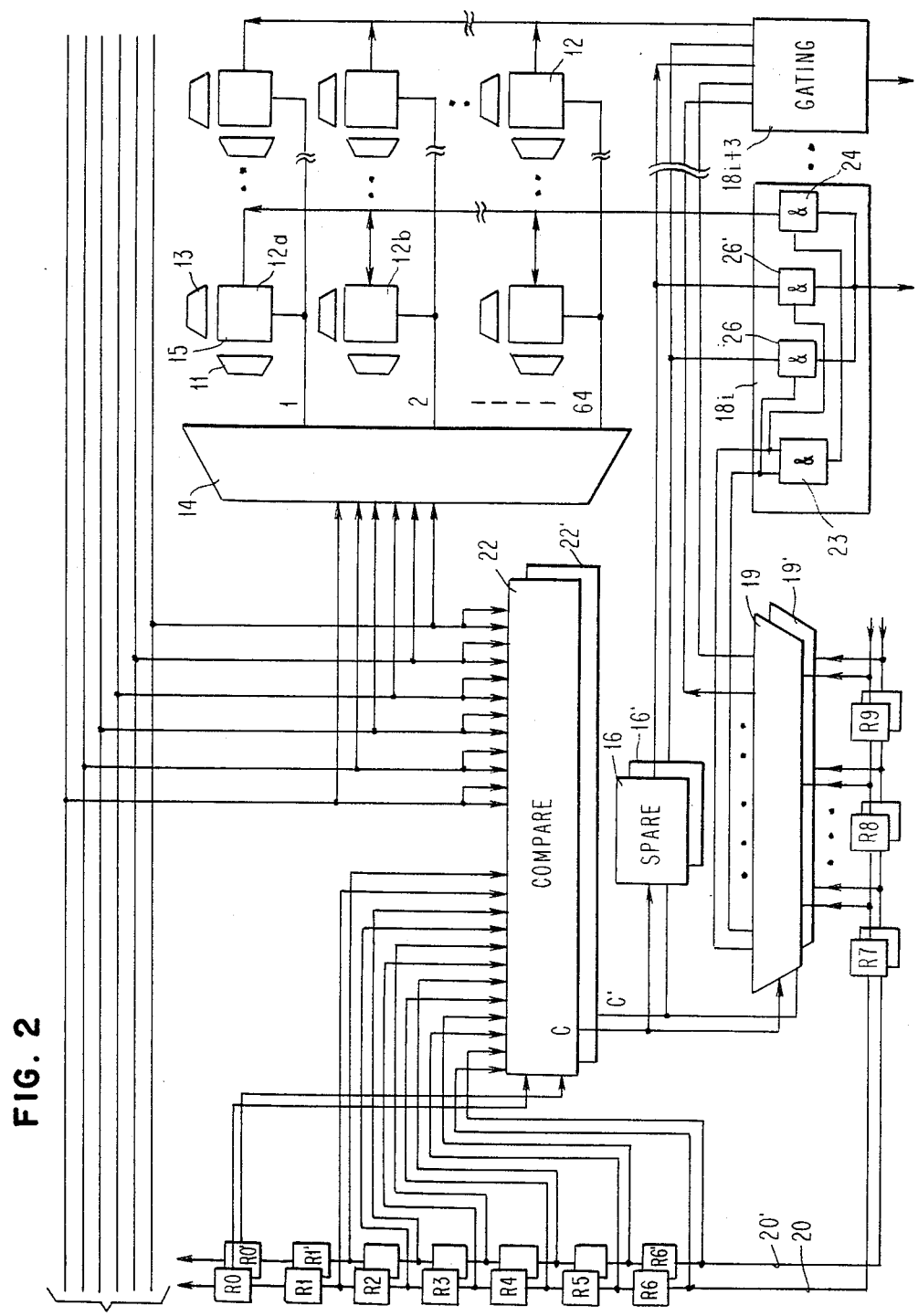
FIG. 2 is a schematic diagram of a memory card in the memory of the computer system in FIG. 1.

FIG. 1 shows a memory for storing 144 bit code words or quadwords on 36 cards 10 each containing four bit positions of the codeword where 128 of the bit positions are data bits and the remainder are ECC check bits of a double error correction/multiple error correction (DEC/TED) code. As shown in FIG. 2, all the storage bits in each bit position $B_i$ to $B_{i+3}$ of any array card 10 of the memory are arranged in a column of 64 separate 256×256 arrays 12 of storage cells each array beng accessed by a separate row select line from a decoder 14 which receives a 6 bit row address and decodes it to produce an access signal on one of the 64 row access lines. This access signal selects one row of chips 12 on the card. Each of the cards 10 in FIG. 1 has a similar decode where scheme a chip row address enables only one of the 64 chips in each of the 144 columns of the memory.

An X-Y coordinate address is supplied to all of the chips 12 on the cards 10. This supplied to a word decoder 11 and a bit decoder 13 to select a single storage cell in each of the arrays 12. Thus, as a result of a combinaton a row select address and an X-Y coordinate address a single bit in each of the 144 columns shown in FIG. 1 is selected.

Figure 3:
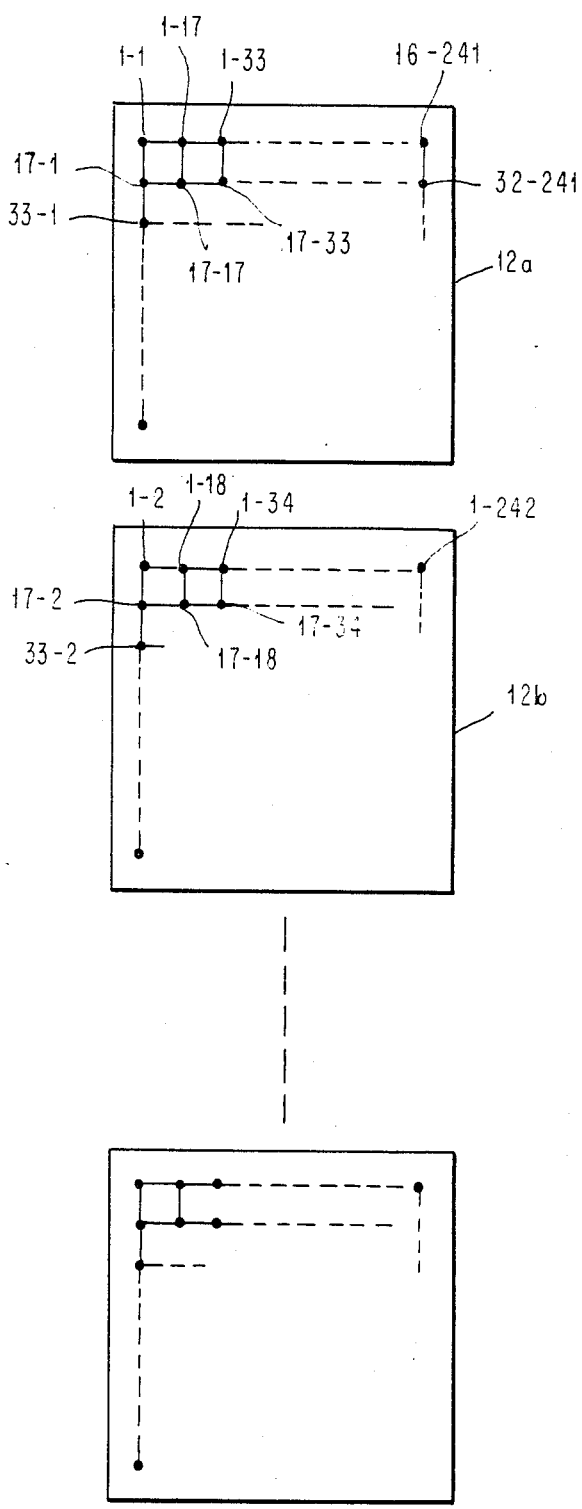
FIG. 3 is a schematic drawing of a column of arrays in the memory card of FIG. 2.

This memory is a paging store, that is, data is read out of this store in pages of 256 codewords each. The pages are interleaved among the arrays 12 with 16 codewords in each page of a given array 12. Each codeword in a page has the same Y address, a different X address and of course any codeword of a page may have 1 of 16 different chip row addresses. FIG. 3 shows the arrays 12a and b for bits in the first bit position of codewords. The numbers on the bits correspond to page, and word position. Thus, the left hand bit in the top most row is numbered 1—1 since it is in the first word of the first page. The next bit position in that row is number 1-17 since it is the 17th word of the first page and so on until the last or left hand bit which is numbered 16-256 to indicate it is the 256th word of the sixteenth page. As shown, the second row of the array contains the storage cells for the first bit position of words 1, 17, 33 . . . 241 for the 17th to 32nd pages, the third line contains the storage cells for the first bit position of words 1, 16, 32 . . . 240 of the 33rd to 48th pages and so on until the 4096th page. Cells for bit positions of word 2, 18, 34 . . . 242 for pages 1 to 4096 are contained on the second chip 10b and cells for the bit positions of words 3, 19, 35 . . . 243 of pages 1 to 4096th page are contained on the third chip and so on so that all bits for the first 4096 pages are contained on the top 16 chips of the column. FIG. 4 shows the effect that different types of failure categories have on this memory. The first column describes the type of failure. The second column tells the number of pages affected by the type of failure listed along side it in the first column. The third column tells how many words will be affected by the failures, while the fourth and fifth columns contain the word and page addresses of the faults.

Referring back to FIG. 2, it can be seen that two spare array chips 16 are placed on each of the cards 10. Either of the spare array chips 16 can be substituted for any one of the 256 chips on the card 16. To accomplish this substitution of a 9 bit substitution address R0-R8 is stored in one of two shift register strings 20. As shall be seen, the data in each shift register string controls the substitution of one of the spares 16 for one of the arrays 12.

The first seven bits R1-R6 of the substitution address are fed into a compare circuit 22 where bit R0 operates as a bit circuit enable signal and bits R1 to Rb are compared with the chip row select address. If they match, a compare signal is generated enabling the appropriate spare 16 so that it can be accessed through the data gating circuitry 18 in place of a bad chip. The output of the compare 22 is also used to enable the one of two decoder circuits 19 which receive the other three bits R6-R8 fed into the particular shift register 20. The decode circuit selects one of the four bit or column positions $B_i$ to $B_{i+3}$ for substituting the spare array 16 for the array 12 in that column position only when the spare 16 is activated by an enabling output from the compare circuit. To accomplish the substitution the output of the decoder 19 is fed to the data gating select circuit 18 controlling the output of the particular bit position.

In each bit position $B_i$ to $B_{i+3}$ one output from each of the decoders 19 output is fed into AND gate 23. So long as the given decoder output of both decoders 19 is not up, the complemented output of AND gate 23 activates AND gate 24 to pass data to and from the chips 12 along the bit line $B_i$. When either decoder output in that bit position comes up the AND gate 24 becomes deactivated and an AND gate 26 is activated by the true of that decoders output substituting one of the spares 16 for the disabled chip 12. Thus, it can be seen so long as all the chips are good on the card, the address placed in either shift register 20 is all zeros, and replacement control latch is zero preventing the decoders 19 from deselecting any chip 12 in one of the bit positions $B_i$ to $B_{i+3}$ and substituting a spare 16 therefore. When there is a non-zero output in any of the register positions $R_6$ to $R_8$ one of the active output lines of the decoder 19 will be selected permitting the substitution.

The substitution of array chips 16 for a chip 12 is controlled by a count of the non-zero syndromes generated by the ECC logic 30 shown in FIG. 1. The ECC logic 30 receives a 144 bit code word from the memory 32 and generates error syndrome bits by comparing stored check bits with ECC generated bits. A non-zero detector 36 generates an output each time all the syndrome bits are not zero and feeds this output to a counter 38. This counter is automatically reset to zero at regular time intervals. This counter 38 counts the outputs of the non-zero detector 36 between reset time and if the count exceeds a threshold count one or more times during this interval, then the counter provides a signal to the chip kill testing apparatus 40 and resets itself to zero. The testing apparatus 40 then tests the memory for a bad chip. If a completely bad chip 12 is detected, its address is sent by spare replacement logic cntrol function 42 in the memory controller or maintenance console into one of the registers 20 of the card 10 on which the bad chip 12 is mounted to substitute a chip 16 for the failed chips 12. The system determines the address of the bad chip from the syndrome bits S1 to S16 of the code words or by other code words in the error pattern of FIG. 3 wich update the counter.

If the test does not turn up a completely bad chip it will not cause the substitution. Instead, it allows the faulty but still viable cip 12 to remain in the memory until the computer system containing the memory goes into diagnostic mode for some other reason. Then a complete diagnostic analysis of the whole memory system is performed and the locations of the bad bit or word lines are detected and the spares are used to substitute for faulty chips, giving the highest priority for chip-kills causing UEs, followed by chip-kills and line-kills respectively. Because of the periodic reseting of the counter 38 it is unlikely chips containing individual cell fails or line fails will invoke the test procedure because the count in the counter will never reach the count of the threshold level before the counter is cleared. Therefore it is only when there is chip with chip-kill or island-kill type of fault the test procedure is performed.

Figure 5:
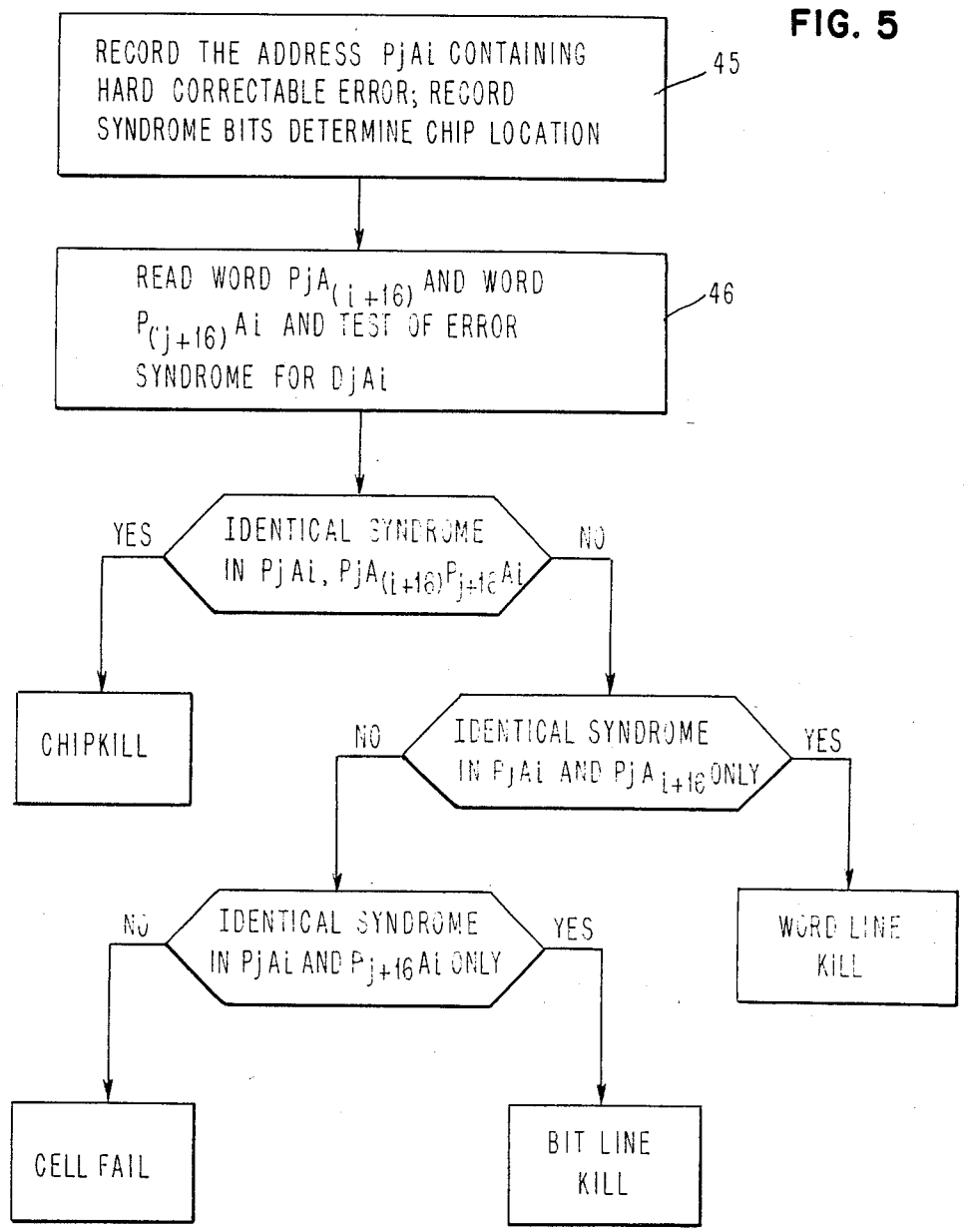
FIG. 5 is a diagram of the test algorithm used in the memory of FIG. 1.

A better understanding of the test procedure can be obtained from the flow diagram of FIG. 5. As shown, when the non-zero syndrome counter 38 indicates the number of non-zero syndromes has exceeded the threshold level, the page and word address $Pj\ A_i$ of the bad bit is generated by the bad bit locator 44 and stored 45. The next step 46 is to test the memory for killed chips. This is done by generating syndromes for words $P_jA_i$; $P_jA_{(i+16)}$; $P_{(j+16)}A_i$. As can be seen from FIG. 3, the bit words $P_jA_{(i+16)}$ $P_{(j+16)}\ A_i$ are located on the same chip adjacent to the failed bit in $P_jA_i$ on a common bit or word line with the failed chip. The assumption being made in the test is that if two bits on the same line are bad the line is bad and if both the tested word line and bit line are bad the chip is all bad. The testing is done by placing test words into the memory and generating the syndromes from those test words.

1. From the first 16 quadwords in page $P_j$ determine the quadword address $A_i$ containing the stuck bit. As pointed out above, the error correcting code syndrome will identify the bit position. Note the word address Ai. From PjAi and bit position identify the faulty chip location.
2. Identify possible the stuck bit position in memory word $PjA_{i+16}$ or $PjA_{i+32}$ by noting the error syndrom bit from ECC apparatus. Also identify the possible stuck bit position for word $A_i$ in page $P_{j+16}$.
3. Test for identical bit stuck positions by comparing error syndrome bit from these words determine the fault type as shown in the flow diagram if FIG. 2.
   (a) Identical stuck bit positions in words PjAi, $PjA_{i+16}$ and $P_{j+16}A_i$ implies chipkill.
   (b) Identical stuck bit positions in words PjAi, $PjA_{i+16}$ but not in $P_{j+16}A_i$ implies a word linekill.
   (c) Identical stuck bit position in word PjAi and $P_{j+16}A_i$ but not in $PjA_{i+16}$ implies bit linekill.
   (d) Stuck bit position in PjAi alone implies a cell fail.

Further verification of an already identified fault type is always possible by randomly selecting and testing for same stuck bit positions as shown in (a), (b), (c), and (d) on words such as $PjA_{i+32}$, $PjA_{i+48}$. . .; and, $P_{j+32}Ai$, $P_{j+48}Ai$. . . respectively. It is noted in FIG. 4 that the occurence of chipkill effect ¼ of BSM in the memory.

If a chipkill pattern is found by 54 the chip is replaced 56 on a fly and the synchronous counter is reset 60. If a chipkill is not found, the counter continues to count and automatically resets at regular time interval. If the threshold is not exceeded again, normal operation is continued without substitution. If the threshold is exceeded the page Pj is deallocated and normal operation is continued. The page is also deallocated when a uncorrectable error is turned up by the EEC apparatus and normal operation is resumed. As explained previously, the next time the machine goes into diagnostic mode, all spare chips are assigned in such a way so that UEs and correctable error in the memory BSM are minimized.

Figure 6:
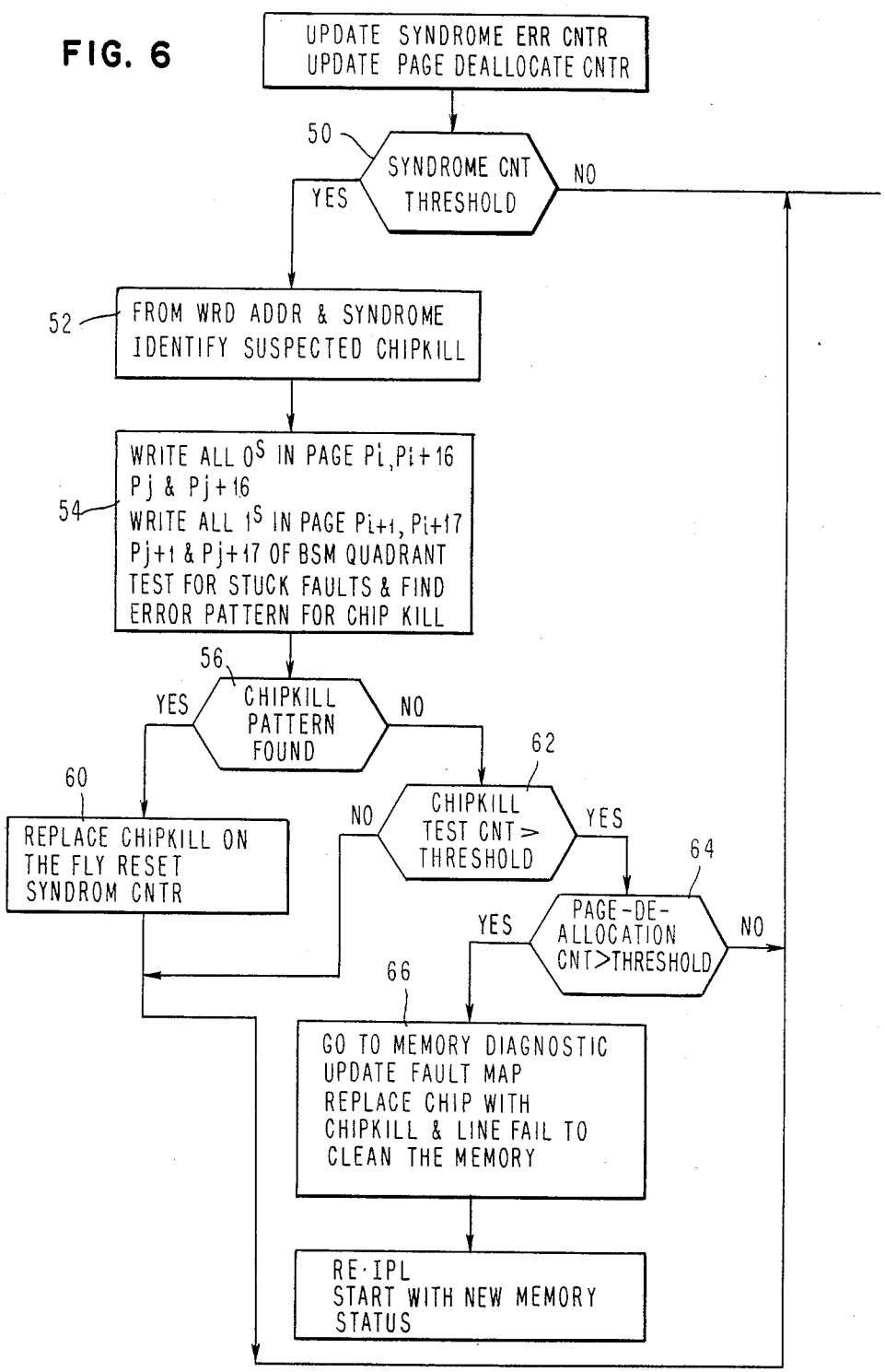
FIG. 6 is a diagram of a replacement algorithm used in the memory shown in FIG. 1.
Figure 7:
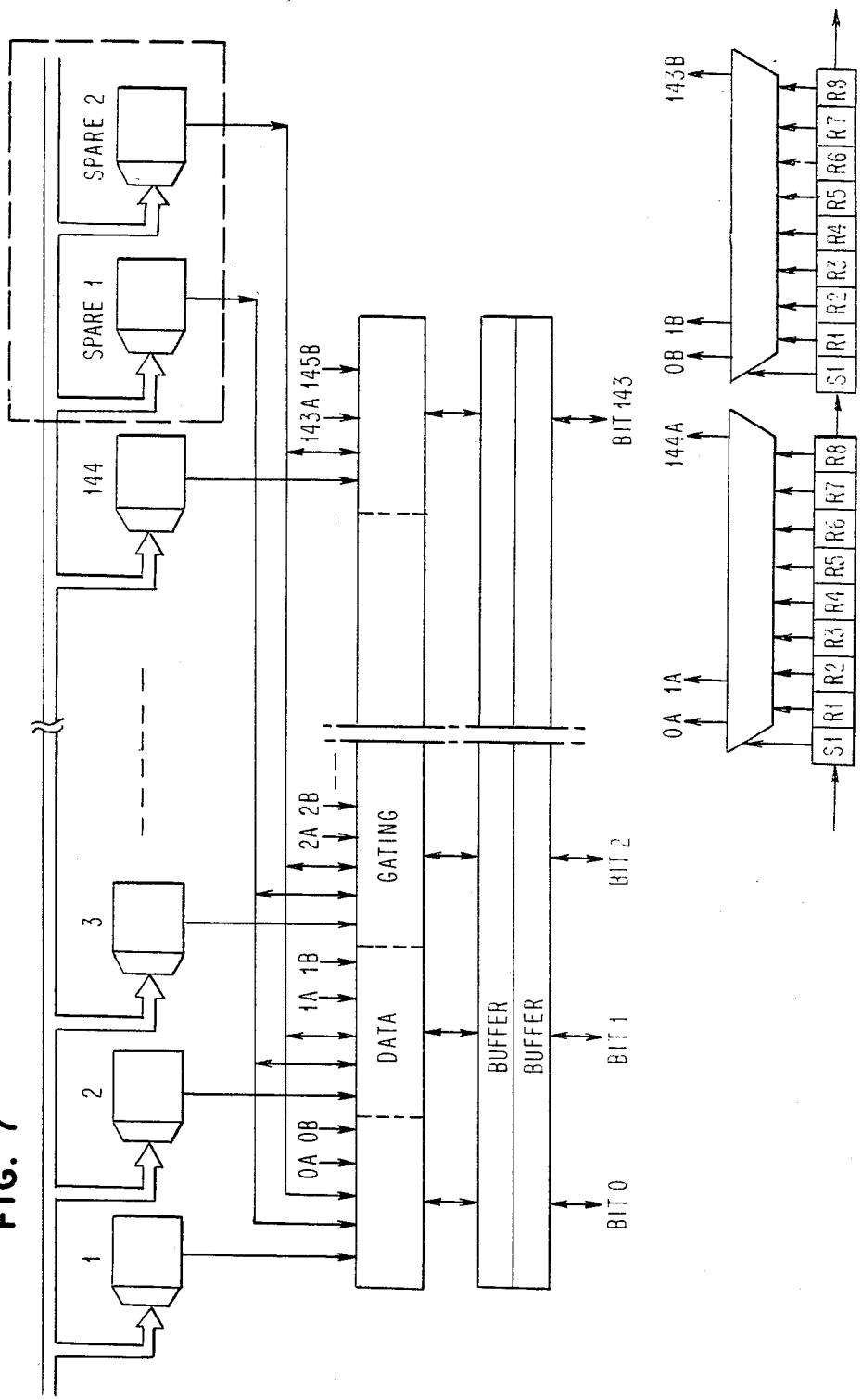
FIG. 7 is an alternative form of a memory that incorporates the present invention.
Figure 8:
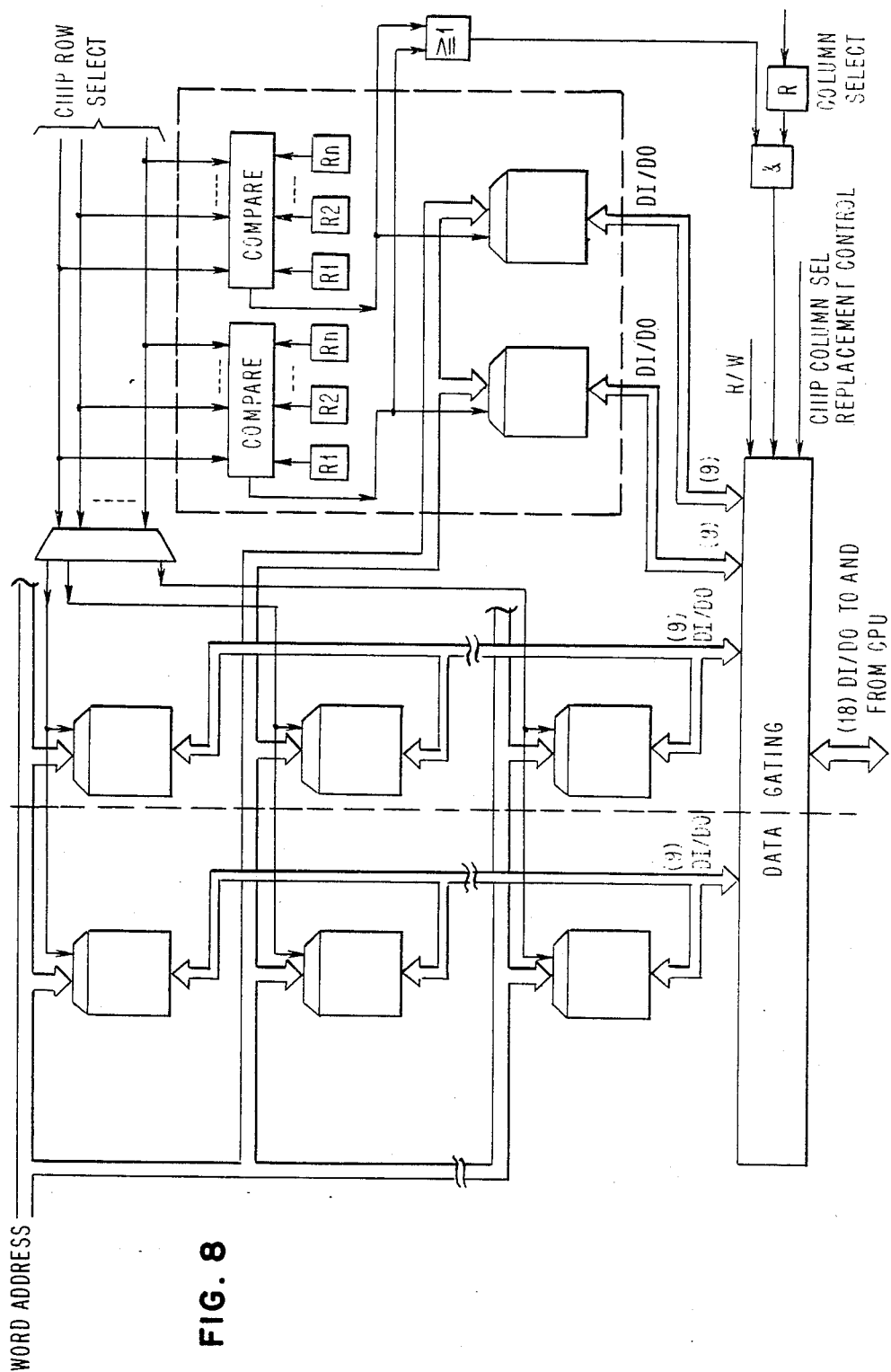
FIG. 8 is another alternative form of a memory using multi-bit array chip organizaton.

Above I have described one embodiment of my invention. This embodiment is of a paging store. However, as shown in co-pending application Shah et al. (IBM Docket No. PO9-83-009) filed on even date herewith and entitled "Reconfigurable Memory Using Both Address Permutation and Spare Memory Elements", the invention is not limited to backing stores with certain modifications. This sparing technique can be used in combination with address permutation apparatus in small main stores, or in combination with double complement apparatus using the same testing algorithm. However the testing algorithm is a function of memory organizations. Before the testing techniques described herein can be used, the location of bits indicating chip kills or bits indicating word and bit line failures must be identified in the memory under consideration. Another memory using the same an algorithm is shown in FIG. 6. Here the placement of the two spares 16 can be made into any one of the 144 chips where each chip contains one bit $B_i$ of the code word. Such card organization is selected for obtaining high data rate from the BSM. A substitution is made when either S1 or S2 are non-zero, activating one of the decoders. Then the bits $R_1$ to $R_8$ in the shift register specifies which array is to be replaced. The decoders data gating and shift registers operate in the manner described in connection with the previously described embodiment to accomplish the substitution. A third embodiment of card design is shown in FIG. 7 where multibit chips of 256K bit organized as 64×4 bit. This also uses one or two spare arrays per card. The ECC code with this embodiment is singl package correct/singl package detect. Upon the detection of 2–4 bit package error the spare is substituted for defective arrays, while single bit errors in BSM are corrected by single bit error correction capability of the code.

Above I have described three embodiments in our invention. It should be apparent that the invention is adaptable to varying memory configurations. The unit of replacement can also be multi-chip array modules on card or complete array card in a BSM. Therefore, such card and module replacements may be necessary in some cases to overcome a support logic fail. Also, the designer can choose to make replacements offline after each memory diagnostic step for simplification. Therefore it should be apparent to those skilled in the art that many modifications and changes can be made in this described embodiment without departing from the spirit and scope of the invention as represented in the attached claims.

Having thus described my invention, what I claim as new and desire to secure by Letters Patents is:

1. In a computer system having a memory protected by an error checking arrangement in which data is stored in multi-bit position code words with different bit positions on different arrays, the improvement comprising:
   counter means for counting the number of occurrences of correctable errors detected by the error checking arrangement during a time period;
   test means for testing the memory for bad arrays only when the count in the counter means exceeds a predetermined number not likely to occur in said time period unless there is an array failure as opposed to the failure of unrelated single bits of the memory; and
   spare array substitution means for substituting a spare array for an array in said memory that tests bad by said test means.

2. The computer system of claim 1 wherein the bit positions of a code word are contained on a plurality of cards each containing a number of arrays and
   spare array substitution means on each card including at least one spare array to be substituted for an array that tests bad by said testing means.

3. The computer system of claim 1 wherein said error checking arrangement is an error detection and correction system, and
   said predetermined number is in excess of that likely to be caused by single cell failures in said arrays but will detect failure of multiple row and column failures in a single array.

4. The computer system of claim 3 wherein said testing means checks for multiple row and column failures and said spare array substitution means affects said substituion only when said test means detects a multiple row and column failure.

5. The computer system of claim 4 wherein the bit positions of a code word are contained on a plurality of cards each containing a number of arrays, and spare array substitution means on each card including at least one spare array to be substituted for an array that tests bad by said testing means.

6. In a computer system having a memory protected by an error correction system capable of correcting multiple errors in a code word with each bit position of the code word in a different array and arrays of the code word arranged in a plurality of cards each card having decoding means for selecting which arrays have been accessed, the improvement comprising counter means for counting the number of occurrences of correctable errors detected by the error checking arrangement to generate a predetermined count not likely to be reached as a result of accumulation of random single bit failures test means for testing for bad arrays when the count in the counter exceeds said predetermined count of failures not likely to be reached as a result of an accumulation of random single bit failures, spare array substitution means on each card that is responsive to identification of bad arrays on that card by said test means.

7. The computer system of claim 6 including means for substituting spare arrays for arrays only with at least a single row or column failure when said arrays are not being used to substitute for a bad array.

8. In a computer system having a memory protected by an error checking arrangement in which data is stored in multibit position code words with different bit positions on different arrays, the method comprising:

counting the number of occurrences of correctable errors detected by the error checking arrangement periodically resetting the count to a base count, testing the memory for bad arrays when between resets the count of said occurrences exceeds a predetermined number in excess of those likely to be caused by unrelated single bit failures word line failures, or bit line failures, substituting a spare array for each array that the tests indicate contain failures other than unrelated single bit failures leaving those arrays containing unrelated stuck bits in the memory.

9. The method of claim 8 wherein said counting is done offline during memory diagnostics.

10. The method of claim 8 where said testing occurs only when said predetermined number is sufficient to indicate that an array has failed as opposed to a lower number that may indicate the failure of a bit line or a word line in an array.

11. The method of claim 10 including categorizing the failures uncovered by said testing of the memory into array failures, bit line failures, word line failures and single bit failures and initially assigning spare arrays for substitution only for arrays that the test indicated incurred an array failure and thereafter assigning remaining spare arrays for substitution for arrays with bit line and word line failures.

12. In a computer system having a memory protected by an error correction system capable of detecting and correcting errors in code words having the bits of the code words segregated into arrays each array containing only the bits of one bit position of the code words where the arrays of the code words are arranged in two dimensional matrices in a plurality of cards each card with means accessing the arrays contained thereon with an address supplied by the computer system the improvement comprising:

storage means on each card for storing the matrix address of an array on said card, compare means on each card for comparing the address received from the computer system with the address stored in said storage means, spare array means on each card, and means for accessing the spare array means and substituting its output for the array at the matrix address supplied by said computer system when said address results in a compare from said compare means.

13. In a computer system having a memory protected by an error detection and correction system in which, data stored in multi-bit position error detection and correction system code words with different bit positions of the code words on different arrays, is accessed in multiple code word pages the method comprising:

counting the number of occurrences of non-zero syndromes by the error detection and correction system that occur in fixed time periods, testing the memory for bad arrays when the count of said occurrences in any one of said fixed periods is sufficient to indicate that an array has failed and is in excess of a count likely to be caused by unrelated single bit failures, word line failures or bit line falures in said arrays, and substituting a spare array for an array that the tests indicate contan array failures leaving those arrays containing unrelated stuck bits operating in the memory.

* * * * *